(12) United States Patent
Hara

(10) Patent No.: US 7,841,077 B2
(45) Date of Patent: Nov. 30, 2010

(54) METHOD FOR MANUFACTURING A WIRING SUBSTRATE

(75) Inventor: Toshiki Hara, Suwa (JP)

(73) Assignee: Seiko Epson Corporation (JP)

( * ) Notice: Subject to any disclaimer, the term of this patent is extended or adjusted under 35 U.S.C. 154(b) by 212 days.

(21) Appl. No.: 11/958,790

(22) Filed: Dec. 18, 2007

(65) Prior Publication Data

US 2008/0173468 A1   Jul. 24, 2008

(30) Foreign Application Priority Data

Jan. 18, 2007   (JP) .............................. 2007-008889

(51) Int. Cl.
*H05K 3/30* (2006.01)
*H05K 1/00* (2006.01)

(52) U.S. Cl. .............................. 29/832; 29/830; 29/831; 29/846; 29/852; 29/854; 174/254

(58) Field of Classification Search .................. 29/832, 29/830, 831, 852, 946, 954, 846, 854; 174/254, 174/264, 255; 361/744, 792, 761, 748
See application file for complete search history.

(56) References Cited

U.S. PATENT DOCUMENTS

| | | | | | |
|---|---|---|---|---|---|
| 4,845,313 | A | * | 7/1989 | Endoh et al. ................. | 174/261 |
| 5,374,469 | A | * | 12/1994 | Hino et al. .................. | 428/209 |
| 5,528,403 | A | * | 6/1996 | Kawaguchi et al. ......... | 349/149 |
| 6,195,260 | B1 | | 2/2001 | Moriyama | |
| 6,320,140 | B1 | * | 11/2001 | Enomoto ..................... | 174/264 |

FOREIGN PATENT DOCUMENTS

| | | |
|---|---|---|
| JP | 11-163475 | 6/1999 |
| JP | 2003-297974 | 10/2003 |
| JP | 2004241915 * | 8/2004 |
| JP | 2005-303172 | 10/2005 |
| JP | 2006-099163 | 4/2006 |

* cited by examiner

*Primary Examiner*—Derris H Banks
*Assistant Examiner*—Tai Nguyen
(74) *Attorney, Agent, or Firm*—Harness, Dickey & Pierce, P.L.C.

(57) ABSTRACT

A wiring substrate comprises: a flexible substrate having a first region and a second region; a wiring line formed on the flexible substrate; and an electronic element that is disposed on the flexible substrate in the first region and electrically coupled to the wiring line. Flexibility of the first region is lower than flexibility of the second region.

6 Claims, 7 Drawing Sheets

METHOD FOR MANUFACTURING A WIRING SUBSTRATE

The entire disclosure of Japanese Patent Application No. 2007-008889, filed Jan. 18, 2007 is expressly incorporated by reference herein.

BACKGROUND

1. Technical Field

Several aspects of the present invention relate to a wiring substrate, a method for manufacturing the same and an electronic apparatus, more particularly, to a method for manufacturing a wiring substrate having flexibility and an electronic apparatus provided with the wiring substrate.

2. Related Art

In recent years, attention has been paid on electronic apparatus capable of being freely bent. For example, flexible displays are electronic apparatuses that can play a role in ubiquitous society since they have shock absorbability, and flexibility to fit comfortably one's hand, and are lightweight for easy carrying.

A method for manufacturing a flexible display is known in which an electronic element such as a thin film transistor (TFT) is formed on a substrate, and then the electronic element is transferred onto the other flexible substrate. For example, JP-A-2003-297974 discloses a technique of manufacturing a pixel transistor by transferring a polysilicon TFT onto a flexible substrate. The polysilicon TFT is usually fixed on the flexible substrate with an adhesive such as an anisotropic conductive paste (ACP) thereafter.

A wiring substrate, in which the electronic element has been mounted on the flexible substrate, is manufactured by the above processes for an electronic apparatus. The electronic element, however, may be peeled off from the flexible substrate if a bending stress exceeds an adhesive stress when the bending stress occurs in the flexible substrate in use. This peeling off may cause an electrical disconnection between a wiring line and the electronic element. In addition, a stress applied to a electronic element may deteriorate the durability of the electronic element or break it down.

SUMMARY

An advantage of the invention is to provide a wiring substrate that can assure an electrical connection of an electronic element by preventing the electronic element from being peeled off from a flexible substrate, and a method of manufacturing the same, and an electronic apparatus provided with the wiring substrate.

According to a first aspect of the invention, a wiring substrate includes a flexible substrate having a first region and a second region, a wiring line formed on the flexible substrate and an electronic element that is disposed on the flexible substrate in the first region and electrically coupled to the wiring line. Flexibility of the first region is lower than that of the second region.

The wiring substrate can suppress the first region in which the electronic element is disposed from being bent when a load is applied to the wiring substrate since the flexibility of the first region is lower than that of the second region. Therefore, the peeling of the electronic element mounted on the wiring substrate can be prevented while the flexibility of the wiring substrate is totally secured.

In this case, the flexible substrate may be made of a resin to be hardened by applying predetermined energy and the resin is hardened in the first region in which the electronic element is disposed. As a result, the flexible substrate having a different flexibility in the hardened region and non-hardened region can be achieved. The flexibility is defined by the Young's modulus or the like.

In this case, a reinforcing layer having flexibility lower than that of the second region may be provided on one surface of the flexible substrate. The one surface is opposite to the other surface, on which the electronic element is disposed, of the flexible substrate. The reinforcing layer provided on the flexible substrate can reduce the flexibility of the first region in which the reinforcing layer is provided.

According to a second aspect of the invention, a method for manufacturing a wiring substrate includes forming a wiring line on a flexible substrate having a first region and a second region, reducing flexibility of the first region of the flexible substrate, and fixing an electronic element to the first region.

According to a third aspect of the invention, a method for manufacturing a wiring substrate includes reducing flexibility of a first region of a flexible substrate, forming a wiring line on the flexible substrate, and fixing an electronic element to the first region.

According to a fourth aspect of the invention, a method for manufacturing a wiring substrate includes forming a wiring line on a flexible substrate, fixing an electronic element to a first region of the flexible substrate, and reducing flexibility of the first region.

The method can suppress the first region in which the electronic element is disposed from being bent, when a load is applied to the wiring substrate, by reducing the flexibility of the first region before or after fixing the electronic element. As a result, the wiring substrate can be manufactured in which the peeling of the electronic element mounted on the wiring substrate is prevented while the flexibility of the wiring substrate is totally secured. The wiring line and the electronic element are electrically coupled. The wiring line and the electronic element may be directly connected or coupled with a different line connecting them.

It is preferable that the flexible substrate include a resin to be hardened by applying predetermined energy, and the energy be supplied to the first region in the reducing of the flexibility of the first region. As a result, a different flexibility can be achieved in a region to which energy is supplied and other regions to which no energy is supplied.

It is preferable that the reducing of the flexibility of the first region further include forming a reinforcing layer having flexibility lower than that of the second region to the first region. As a result, a different flexibility can be achieved in a region to which the reinforcing layer is provided, and other regions to which no reinforcing layer is provided.

It is preferable that the flexibility of the first region be continuously reduced in a peripheral region thereof in the reducing of the flexibility of the first region. This varying flexibility can prevent the border region between the first region in which the electronic element is disposed and its peripheral region from being locally damaged. As a result, the breakage of the flexible substrate, the disconnection of the wiring line and the like can be prevented.

It is preferable that the electronic element further include a terminal, and the terminal be electrically coupled to the wiring line to fix the electronic element on the flexible substrate in the fixing of the electronic element. As a result, the electronic element is electrically coupled and mechanically bonded to the wiring substrate simultaneously.

According to a fifth aspect of the invention, an electronic apparatus includes the wiring substrate mentioned above. The electronic apparatus having improved electrical reliability and durability can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings.

Figure 1:
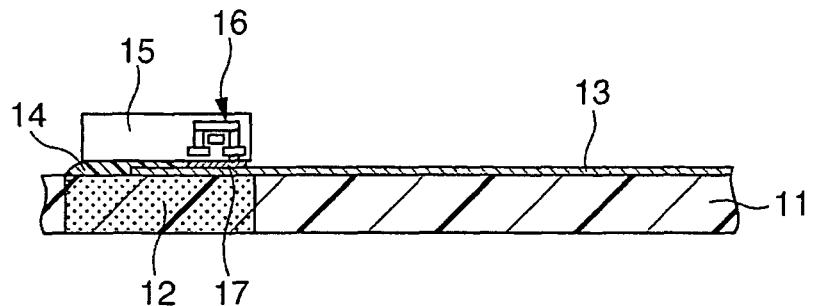
FIG. 1 is a sectional view illustrating a wiring substrate of a first embodiment of the invention.

FIG. 1 is a sectional view of a wiring substrate according to a first embodiment of the invention.

A wiring substrate 10 includes a flexible substrate 11, a wiring line 13 formed on the flexible substrate 11, and an electronic element 15 that is fixed (mounted) on the flexible substrate 11 and electrically coupled to the wiring line 13.

The flexible substrate 11 is provided with a hardened region 12, in which the electronic element 15 is mounted, having flexibility lower than that of other regions of the flexible substrate 11. The hardened region 12 has the flexibility extremely smaller than that of the other regions of the flexible substrate 11. This structure allows the hardened region 12 to be suppressed from being bent even when a load is applied to the wiring substrate 10. In addition, the flexibility preferably varies continuously from the border between the hardened region 12 and its peripheral region. This varying flexibility can prevent the border region from being locally damaged. As a result, the breakage of the flexible substrate 11, the disconnection of the wiring line and the like can be prevented.

Examples of the material for the flexible substrate 11 include energy-curable resins such as light curable resins, thermosetting resins, and electron beam curable resins. The hardened region 12 is formed by a desired energy selectively applied.

Examples of the light curable resins include epoxy, acrylic, polyimide, urethane, and acrylate resins.

Examples of the thermosetting resins include phenol, epoxy, and urethane resins.

Examples of the electron beam curable resins include acrylic, vinyl ether, silicone, fluorine, and long-chain alkyl resins.

The wiring line 13 is formed on one surface of the flexible substrate 11. The wiring line 13 may be provided on the other surface of the flexible substrate 11. The wiring line 13 is made of a conductive material, which is a single-layer film or multi-layer film of Au, Ta, Cu, Ti, Ni, and Ag, for example.

The electronic element 15 is mounted on the one surface of the flexible substrate 11. The electronic element 15, in this case, includes a thin film transistor 16 and a terminal 17 formed on its surface. The terminal 17 is electrically coupled to the thin film transistor 16. The thin film transistor 16 is mounted on the flexible substrate 11 so that the terminal 17 faces the flexible substrate 11. The thin film transistor 16 is exemplarily shown as an electronic circuit included in the electronic element 15.

Examples of the electronic element 15 may include, not limited to, active elements such as transistors and diodes, passive elements such as resisters and capacitors, and auxiliary elements such as connectors and terminals. Examples of the electronic element 15 also may include semiconductor lasers and light-emitting diodes. Examples of the electronic element 15 further may include elements other than semiconductor elements, and circuits including a plurality of elements.

An anisotropic conductive adhesive 14 is provided between the flexible substrate 11 and the electronic element 15, for example. The anisotropic conductive adhesive 14 mainly contains conductive particles and an adhesive (binder). The former electrically conducts electrodes facing each other, while the latter takes a role of mechanically fixing a connected region.

The conductive particles should have a shape to be free from touching both adjacent electrodes and an appropriate dispersion rate as well as electrical conductivity. Examples of the conductive particles include various surface-treated ones: a metal core (nickel (Ni) or Ni plated with gold) and a resin core (styrene, acrylic, titanium oxide, or the like) plated with gold; and these cores covered with an insulation film that is broken and melt with heat and pressure. A shape similar to sphere is chosen. Materials having a particle diameter of from several micron-meters to several tens of micron-meters are used depending on a product to be used. Examples of material used for the binder include synthetic rubbers, thermoplastic resins, and thermosetting resins.

The connection principle is as follows: the binder is pressed and extended by heat and pressure applied for a fixed period of time (thermal compression bonding process); at least one or more conductive particle is sandwiched between electrodes facing each other (in this case, between the terminal 17 and the wiring line 13); and as a result, electrical anisotropy is achieved which shows a conductivity in the thickness direction while insulation properties in the face direction of the compression-bonded region.

As a result, the wiring substrate 10, in which the electronic element 15 has been mounted on the flexible substrate 11, is achieved. While only one electronic element 15 is mounted on the flexible substrate 11 as exemplarily shown in FIG. 1, different electronic elements may be mounted.

The wiring substrate 10 of the first embodiment has the electronic element 15 disposed to the hardened region 12 of the flexible substrate 11. This structure can suppress the hardened region 12 from being bent even when a load is applied to the wiring substrate 10. As a result, the peeling of the electronic element 15 due to bending and the occurrence of connection defects between the electronic element 15 and the wiring line 13 can be prevented. Therefore, the peeling of the electronic element 15 mounted on the wiring substrate 10 can be prevented while the flexibility of the wiring substrate 10 is totally secured.

In addition, the flexibility varying continuously from the border between the hardened region 12 and its peripheral region can prevent the border region from being locally damaged. As a result, the breakage of the flexible substrate 11, the disconnection of the wiring line and the like can be prevented.

In the first embodiment, the terminal 17 of the electronic element 15 is mounted so as to face the flexible substrate 11 as an example. The electronic element 15 may be mounted so that the terminal 17 faces a side opposite to the flexible substrate 11, and a different wiring line may be formed to connect the wiring line 13 of the flexible substrate 11 to the terminal 17 of the electronic element 15. In this case, a typical thermosetting or thermoplastic adhesive is provided between the electronic element 15 and the flexible substrate 11.

A method for manufacturing a wiring substrate according to a second embodiment of the invention will be described with reference to FIGS. 2A to 7C.

Figure 2A:
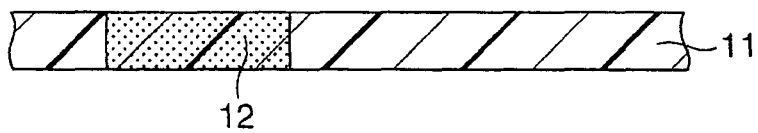
FIGS. 2A to 2D are process sectional views illustrating a manufacturing of the wiring substrate of the first embodiment.

As shown in FIG. 2A, a region, in which an electronic element to be mounted (element mounting region), of the flexible substrate 11 is hardened to form the hardened region 12. The aforementioned materials are used for the flexible substrate 11.

In a case where the flexible substrate 11 is made of a light curable resin, the element mounting region is exposed. In this case, the flexible substrate 11 having continuously varying flexibility from the border between the hardened region 12 and its peripheral region can be obtained by setting conditions by which the polymerization reaction of the light curable resin slightly occurs also in a region light-shielded with a mask. After this step, a light-shielding layer may be formed on the flexible substrate 11 in order to prevent other regions of the flexible substrate 11 from being exposed.

In a case where the flexible substrate 11 is made of a thermosetting resin, the element mounting region is heated with infrared rays to harden the resin. In a case where the flexible substrate 11 is made of an electron beam curable resin, the resin is irradiated with electron beams in a vacuum to be hardened. Also in this case, the flexible substrate 11 having continuously varying flexibility from the border between the hardened region 12 and its peripheral region can be obtained by setting conditions by which the polymerization reaction of the electron beam curable resin slightly occurs even in a region light-shielded with a mask.

Figure 2B:
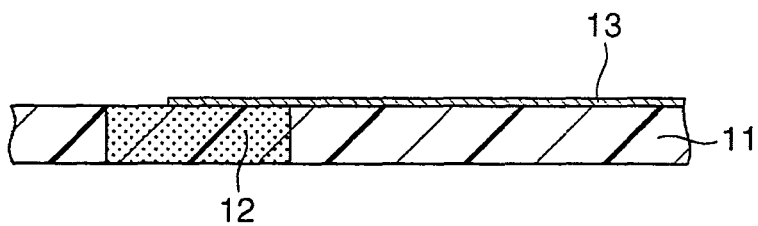

Then, as shown in FIG. 2B, the wiring line 13 is formed on the flexible substrate 11. The wiring line 13 is formed by forming a metal film on the flexible substrate 11 and patterning it. The aforementioned materials are used for the metal film. The wiring line 13 also may be formed by coating a solution containing a conductive material, heating the coated film, and patterning it. The wiring line 13 further may be formed by using a printing method. The printing method needs no patterning since a desired pattern can be drawn by using droplets of the solution containing the conductive material.

Figure 2C:
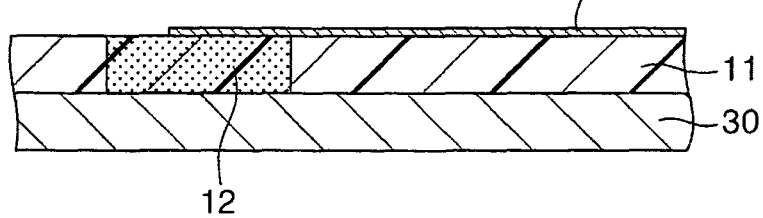

Then, as shown in FIG. 2C, the flexible substrate 11 is attached to a support substrate 30 of rigid material. The reason of attaching the flexible substrate 11 to the support substrate 30 is to make alignment in the transferring step (mounting step) of an electronic element easy and to disperse a load applied in pressurizing and the like. Materials having stiffness appropriate to carry out the above work, such as a glass substrate, are used for the support substrate 30.

Figure 2D:
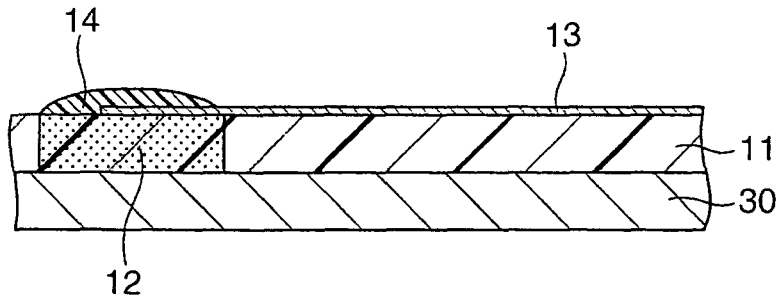

Then, as shown in FIG. 2D, the anisotropic conductive adhesive 14 is provided to the element mounting region (element arranging region) of the flexible substrate 11. The anisotropic conductive adhesive 14 is applied by screen printing, for example. The anisotropic conductive adhesive 14 may also be applied by using a dispensing technique other than screen printing. The anisotropic conductive adhesive 14 also needs not to be a paste form, but may have a film form that can be attached to the element mounting region. In a case where the terminal 17 of the electronic element 15 does not face the flexible substrate 11, a typical adhesive can be provided.

On the other hand, an electronic element including, for example, a thin film transistor is formed on a different substrate. Hereinafter, a manufacturing process of a polysilicon TFT—thin film transistor—will be described as an example.

Figure 3A:
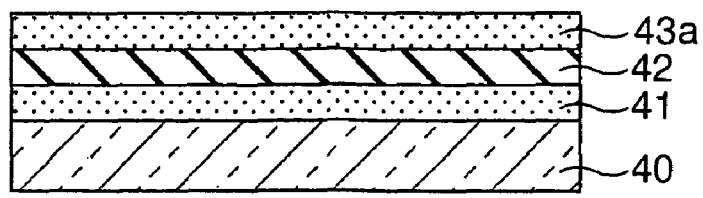
FIGS. 3A to 3D are process sectional views illustrating the manufacturing of the wiring substrate of the first embodiment.

As shown in FIG. 3A, a separation layer 41 made of amorphous silicon is formed on a substrate 40 made of quartz, glass or the like, by plasma CVD using $SiH_4$ or an LPCVD method using $Si_2H_6$. Then, an underlayer 42 made of silicon oxide is formed on the separation layer 41. Next, an amorphous silicon layer 43a is formed on the underlayer 42.

Figure 3B:
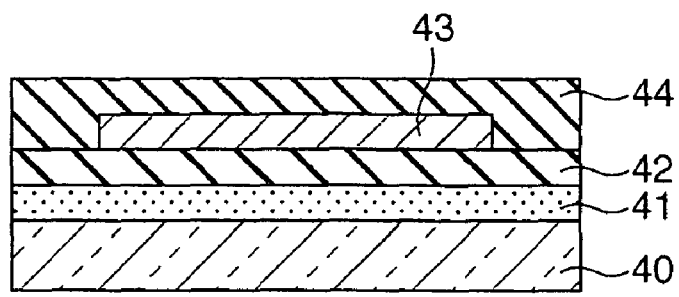

Then, as shown in FIG. 3B, the amorphous silicon layer 43a is irradiated with laser beams to crystallize it to form a polysilicon layer 43. Next, the polysilicon layer 43 is patterned. Then, a gate insulation film 44 made of silicon oxide, for example, is formed on the polysilicon layer 43.

Figure 3C:
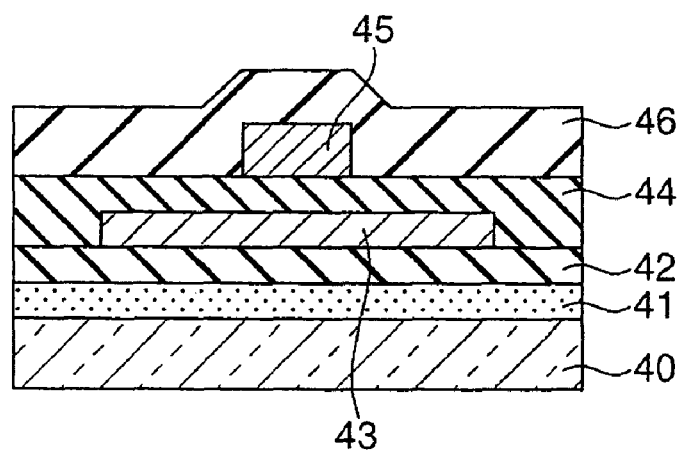

Next, as shown in FIG. 3C, a metal film is formed on the gate insulation film 44, and then the metal film 44 is patterned to form a gate electrode 45. Subsequently, an interlayer insulation film 46, which is made of silicon oxide, for example, is formed on the gate insulation film 44 and the gate electrode 45.

Figure 3D:
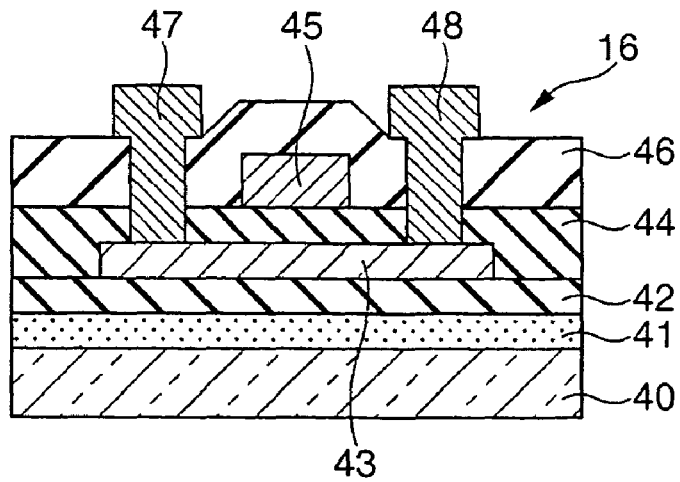

Next, as shown in FIG. 3D, two contact holes are formed to the interlayer insulation film 46 and the gate insulation film 44 so as to reach to the polysilicon layer 43. Next, a metal film is formed on the interlayer insulation film 46 so as to fill inside the contact holes, and then the metal film is patterned to form a source electrode 47 and a drain electrode 48.

As a result, the thin film transistor 16, which is composed of a polysilicon TFT, is formed on the substrate 40 with the separation layer 41 interposed therebetween. While the thin film transistor 16, which is a top gate type, is described as an example, the thin film transistor 16 may be a bottom gate type, in which the gate electrode 45 is disposed to a nearer side to the substrate 40 than the polysilicon layer 43. The film transistor 16 may be an amorphous silicon TFT that uses amorphous silicon having an electron mobility lower than that of polysilicon as an active layer.

Figure 4A:
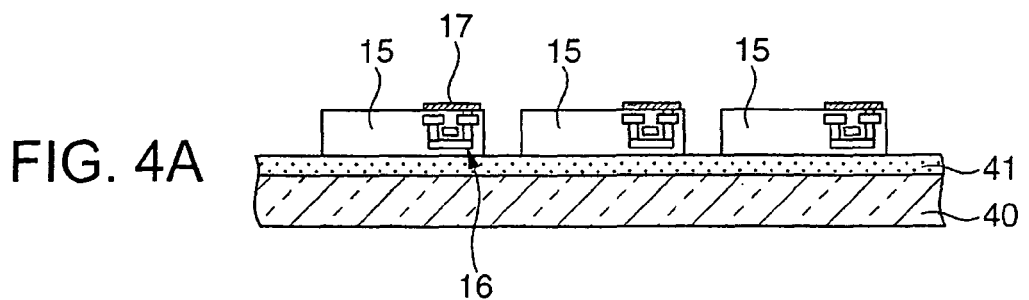
FIGS. 4A and 4B are process sectional views illustrating the manufacturing of the wiring substrate of the first embodiment.

As a result of the above processes to form the thin film transistor 16, as shown in FIG. 4A, a plurality of electronic elements 15 is formed on the substrate 40 with the separation layer 41 interposed therebetween. Each electronic element 15 is usually provided with a plurality of the thin film transistors 16, which forms a circuit to achieve a desired function. The terminal 17 coupled to the thin film transistor 16 is formed on the upper surface of the electronic element 15. The electronic element 15 also may be formed by using active elements or passive elements other than thin film transistor 16 so as to achieve the desired function. In this embodiment, the electronic element 15 functioning as CPUs, memories, and drivers included in peripheral circuits for flexible displays is described as an example.

Figure 4B:
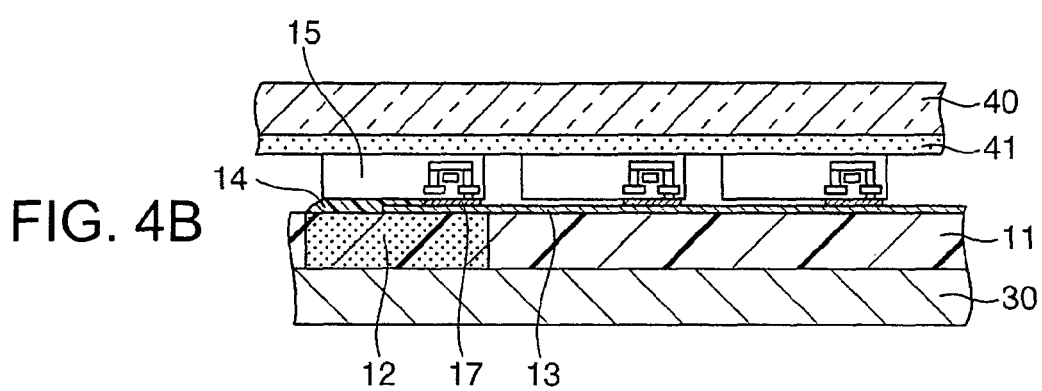

As shown in FIG. 4B, the flexible substrate 11 and the substrate 40 are disposed to be faced each other so that the electronic element 15 and the hardened region 12 are overlapped. Then, the anisotropic conductive adhesive 14 is hardened by energy (e.g. heat) applied while the substrate 40 is pressed. As a result, the electronic element 15 and the flexible substrate 11 are electrically connected and mechanically bonded with the anisotropic conductive adhesive 14 interposed therebetween.

Figure 5A:
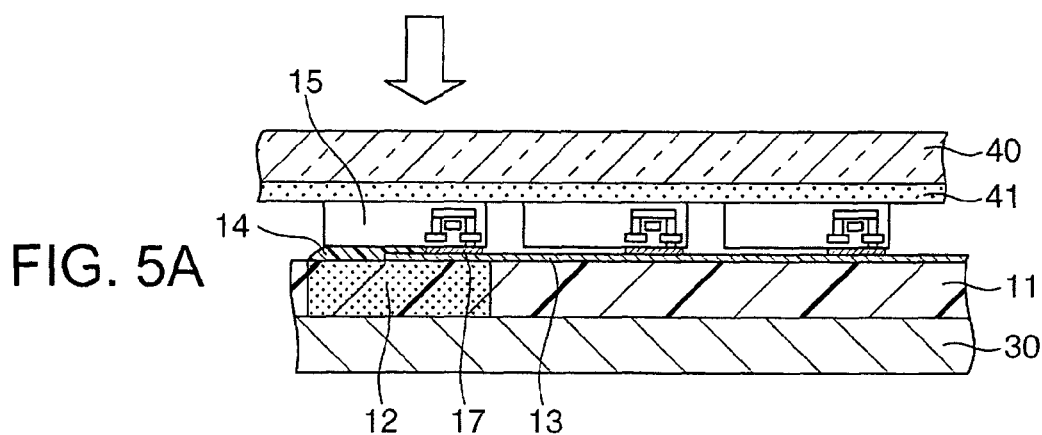
FIGS. 5A and 5B are process sectional views illustrating the manufacturing of the wiring substrate of the first embodiment.

Next, as shown in FIG. 5A, energy is applied to a region, corresponding to the electronic element 15 to be mounted, of the separation layer 41. For example, the separation layer 41 is irradiated with an excimer laser. This irradiation produces an ablation between the substrate 40 and the electronic element 15 to be mounted to come to a state in which the electronic element 15 is likely to be separated with a minimal force. Any laser other than the excimer laser may be used as long as energy enough to produce the ablation of the separation layer 41 can be supplied.

Figure 5B:
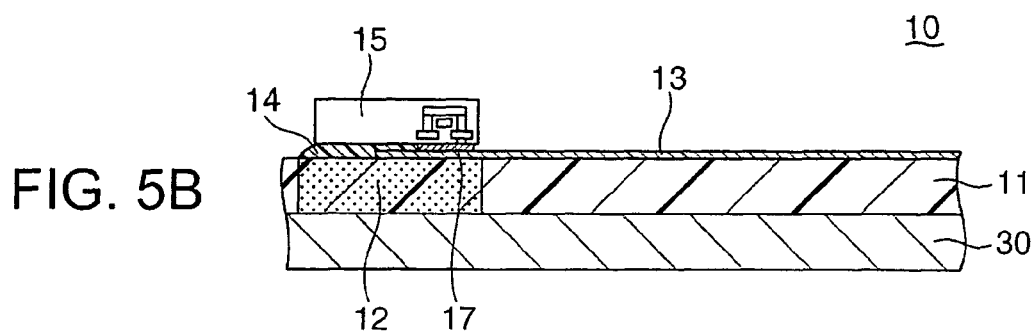

As a result, the wiring substrate 10 of the embodiment is manufactured as shown in FIG. 5B. In order to manufacture the wiring substrate 10 for flexible displays, in the embodiment, an active matrix circuit is formed on the flexible substrate 11 by using an organic thin film transistor. Hereinafter, a manufacturing process of an organic thin film transistor will be described as an example. The support substrate 30 disposed on the back surface of the flexible substrate 11 is omitted in FIGS. 6A to 6D.

Figure 6A:
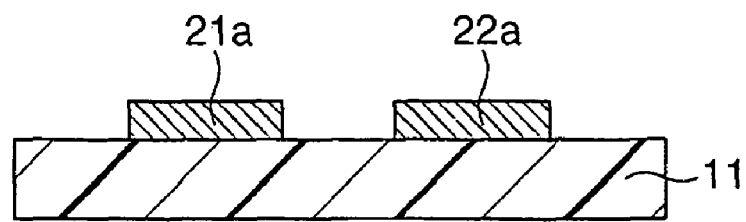
FIGS. 6A to 6D are process sectional views illustrating the manufacturing of the wiring substrate of the first embodiment.

As shown in FIG. 6A, a source electrode 21a and a drain electrode 22a are formed on the flexible substrate 11. The source electrode 21a and the drain electrode 22a can be formed, for example, by coating a solution containing a conductive material, heating the coated film, and patterning it. The source electrode 21a and the drain electrode 22a can also be formed by using a printing method. The printing method needs no patterning since a desired pattern can be drawn by using droplets of the solution containing the conductive material. Examples of the conductive material may include a metal material including Pd, Pt, Au, W, Ta, Mo, Al, Cr, Ti, Cu, and alloys including them, and a metal oxide material such as indium tin oxide (ITO). The source electrode 21a and the drain electrode 22a may be simultaneously formed when the wire line 13 is formed.

Figure 6B:
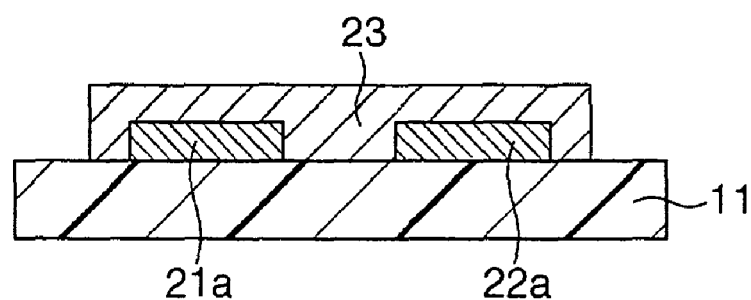

As shown in FIG. 6B, an organic semiconductor layer 23 is formed on the source electrode 21a, the drain electrode 22a, and the flexible substrate 11 between the source electrode 21a and the drain electrode 22a. The organic semiconductor layer 23 can be formed by the following exemplified manner. A solution containing an organic semiconductor material or its precursor is coated (supplied). The resulting coated film is subjected to heating or the like, if needed, and then patterned. The organic semiconductor layer 23 also may be formed by using a printing method. Examples of the organic semiconductor material may include a low-molecular organic semiconductor material such as pentacene, hexacene, and phthalocyanine, and a high-molecular organic semiconductor material (conjugated polymer) such as polythiophene, and poly (p-phenylenevinylene).

Figure 6C:
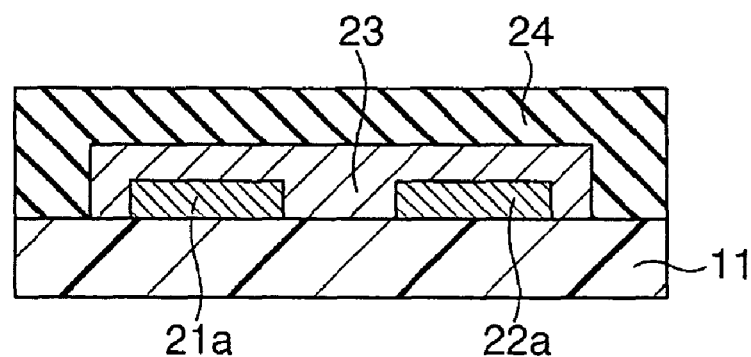

Next, as shown in FIG. 6C, a gate insulation film 24 is formed to cover at least the organic semiconductor layer 23. The gate insulation layer 24 can be formed by the following manner. A solution containing an insulation material or its precursor is coated (supplied). The resulting coated film is subjected to heating or the like, if needed. The gate insulation layer 24 also may be formed by using a printing method. Examples of the material for the gate insulation layer 24 may include an inorganic material such as $SiO_2$, and an organic insulation material such as polystyrene, polyimide, polycarbonate (PC), and polymethylmethacrylate (PMMA).

Figure 6D:
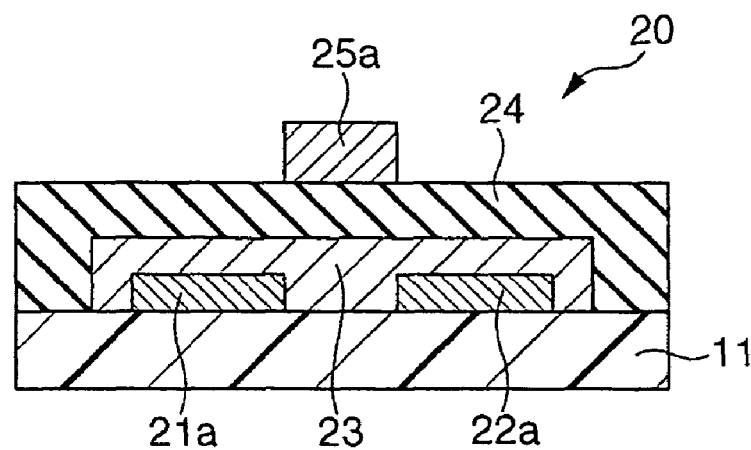

Next, as shown in FIG. 6D, a gate electrode 25a is formed on the gate insulation layer 24. The gate electrode 25a can be formed, for example, by coating a solution containing a conductive material, heating the coated film, and patterning it. The gate electrode 25a also may be formed by using a printing method. Examples of the conductive material may include a metal material including Pd, Pt, Au, W, Ta, Mo, Al, Cr, Ti, Cu, and alloys including them, and a metal oxide material such as indium tin oxide (ITO).

As a result, the organic thin film transistor 20 is formed on the flexible substrate 11. While the organic thin film transistor 20, which is a top gate type, is described as an example in the embodiment, the organic thin film transistor 20 may be a bottom gate type, in which the gate electrode 25a is disposed to a nearer side to the flexible substrate 11 than the position of the organic semiconductor layer 23.

Figure 7A:
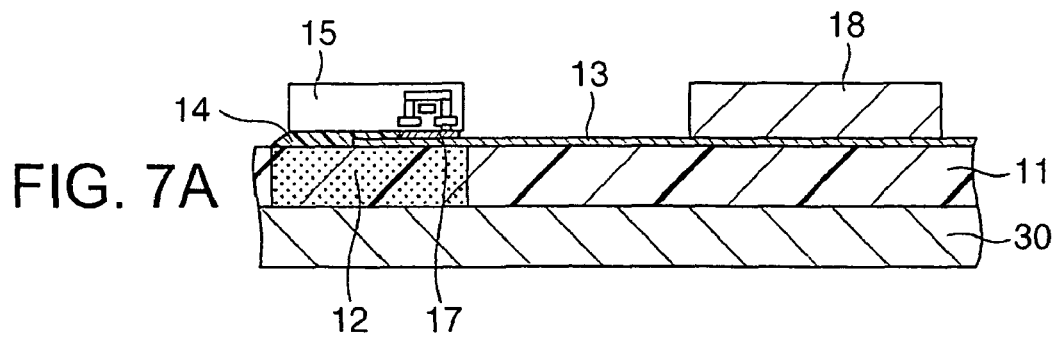
FIGS. 7A to 7C are process sectional views illustrating the manufacturing of the wiring substrate of the first embodiment.

As a result of the above processes to form the organic thin film transistor 20, an active matrix circuit 18 is formed on the flexible substrate 11 as shown in FIG. 7A. The active matrix circuit 18 is provided with a plurality of the organic thin film transistors 20, which is arranged in a matrix and forms a circuit to achieve a desired function. The active matrix circuit 18 also may be formed by using active elements or passive elements other than organic thin film transistors 20 so as to achieve the desired function.

Figure 7B:
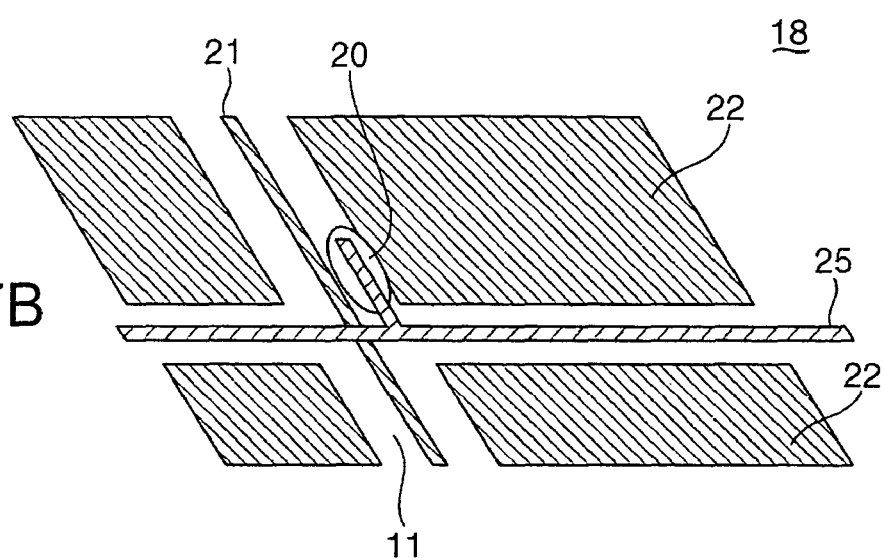

FIG. 7B shows a pixel of the active matrix circuit 18. In the above process to form the organic thin film transistor 20 in a matrix, a pixel electrode 22 coupled to the drain electrode 22a of the organic thin film transistor 20 is formed in a matrix, a data line 21 coupled to the source electrode 21a of the organic thin film transistor 20 is formed in one direction, and a gate line 25 coupled to the gate electrode 25a of the organic thin film transistor 20 is formed in the other direction perpendicular to the one direction. As a result, the active matrix circuit 18 is formed. For example, the pixel electrode 22 and the data line 21 are formed simultaneously in forming the source electrode 21a and the drain electrode 22a of the organic thin film transistor 20. The gate line 25 is formed simultaneously in forming the gate electrode 25a.

Figure 7C:
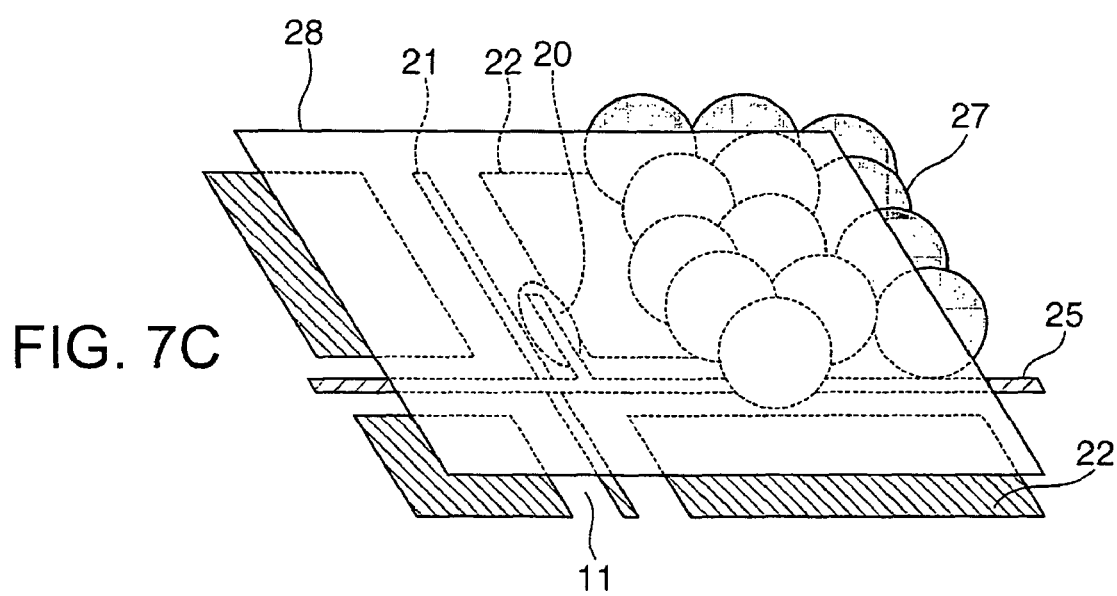

Next, as shown in FIG. 7C, a film in which microcapsules 27 are dispersed is formed on the upper layer of the active matrix circuit 18, for example. Each microcapsule 27 includes an electrophoretic dispersion liquid having a plurality of types of electrophoretic particles, each type having different characteristics. For example, two kinds of electrophoretic particles having different charges and colors are encapsulated. Then, a counter electrode 28 is formed on the film including the microcapsules 27. For example, a sheet made of a transparent electrode material such as ITO is laminated. Alternatively, a counter substrate including the counter electrode 28 may be attached to the wiring substrate. In this case, a counter substrate having flexibility is used.

Through the above, the wiring substrate for electrophoretic displays is manufactured. The wiring substrate of the embodiment can be used for organic EL displays, liquid crystal displays, or the like, and is not limited to any display method. The wiring substrate of the embodiment also can be applied to applications other than displays.

In the electrophoretic display, a selection signal (selection voltage) applied to the gate line 25 makes the organic thin film transistor 20 coupled to the gate line 25 to which the selection signal is applied, an on state. The data line 21 coupled to the organic thin-film transistor 20 and the pixel electrode 22 are thus practically and electrically conducted. Here, if desired data (voltage) is supplied to the data line 21, the data (voltage) is supplied to the pixel electrode 22. At this time, an electric field is generated between the pixel electrode 22 and the counter electrode 28. The electrophoretic particles in the microcapsule 27 are electrophoresed toward either of the electrodes 22 or 28 in accordance with the direction and strength of the electric field.

On the other hand, if the supply of the selection signal to the gate line 25 is stopped, the organic thin-film transistor 20 is switched off and the data line 21 coupled to the organic thin film transistor 20 and the pixel electrode 22 are disconnected. Therefore, adequate combinations of the supply and stop of the selection signal to the gate line 25, and that of data to the data line 21 permit displaying a desired image on the display pixel of the electrophoretic display.

Figure 8:
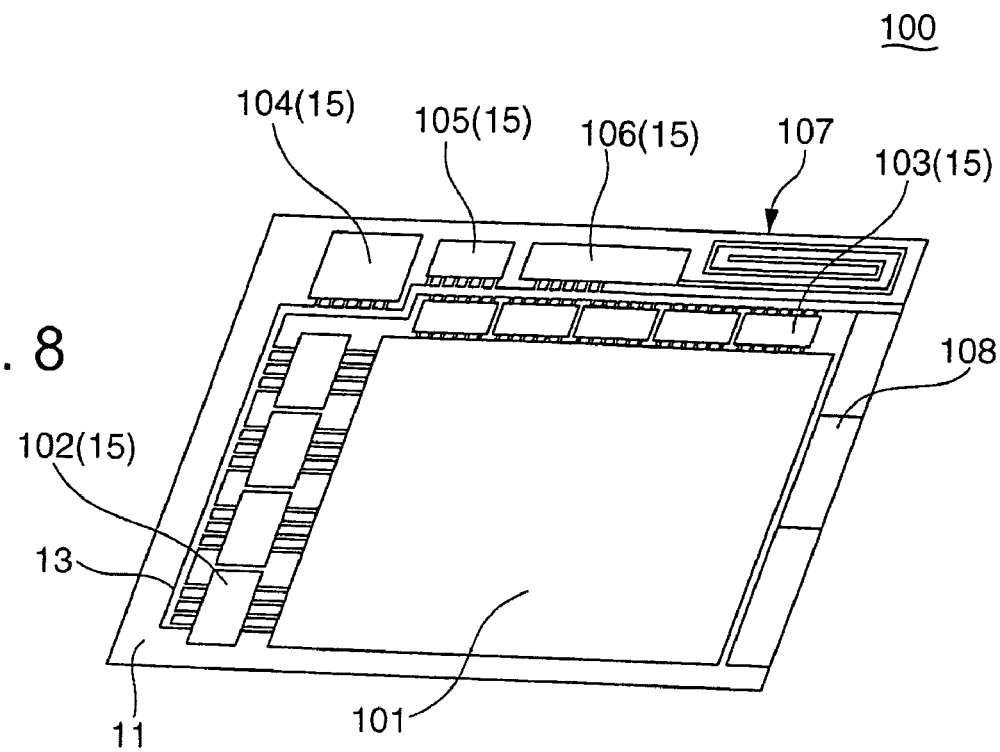
FIG. 8 schematically shows a structure of a flexible display as an example of electronic apparatuses.

FIG. 8 schematically shows the structure of a flexible display as an example of electronic apparatuses of the invention. The flexible display shown in FIG. 8 receives image information without any contact. However, the display is not limited to this type.

A flexible display 100 is provided with a pixel area 101 formed on the flexible substrate 11, a vertical driver 102, a horizontal driver 103, a CPU 104, a RAM 105, an RF circuit 106 and an antenna 107. Each of the above parts (the pixel area 101 to the antenna 107) is coupled to the wiring line 13 formed on the flexible substrate 11.

The pixel area 101 is composed of the active matrix circuit 18, the microcapsules 27, and the counter electrode 28, which are described with reference to FIGS. 7A to 7C.

The vertical driver 102, which is coupled to the gate line 25 of the pixel area 101, outputs a selection signal to select a pixel of the pixel area 101 based on a signal from the CPU 104. The vertical driver 102 is provided with a shift register having outputs corresponding to the number of gate lines 25.

The horizontal driver 103, which is coupled to the data line 21 of the pixel area 101, outputs a data signal corresponding to data to be displayed by a pixel of the pixel area 101. The horizontal driver 103 is provided with a shift register having outputs corresponding to the number of data lines 21.

The CPU 104, which is a central processing unit, controls display operations of whole apparatus by executing a desired software program. The RAM 105 is used as a temporary working region for the CPU 104.

The RF circuit 106 includes a transmitting circuit to output a signal to the antenna 107 and a receiving circuit to receive a signal from the antenna 107. The antenna 107 is provided in a loop shape around the flexible substrate 11.

A solar battery 108 converts light energy into power necessary for display operations. The power is supplied to the CPU 104 and the like. The solar battery 108 has a structure of, for example, a pn junction type or a die-sensitized type. The pn junction type employs a silicon based material such as polysilicon to form a solar battery. The die-sensitized type employs an organic material to directly form a solar battery on the flexible substrate 11.

In the flexible display shown in FIG. 8, the antenna 107 receives radio wave from outside and then image information on the radio wave is retrieved by the RF circuit. The retrieved image information is separated into a selection signal and a data signal by the CPU 104 and the signals are sent to and output from the vertical driver 102 and the horizontal driver 103 respectively.

The flexible display of the embodiment is provided with the peripheral circuits of the pixel area 101 such as the vertical driver 102, the horizontal driver 103, the CPU 104, the RAM 105, and the RF circuit 106 by mounting the electronic element 15 shown in FIGS. 5A and 5B. The pixel area 101 is directly formed on the flexible substrate 11. The solar battery 108 may be formed by mounting the electronic element 15 having a solar battery function on the flexible substrate 11 or directly formed on the flexible substrate 11.

In the embodiment, the hardened region 12 is formed to a region, which corresponds to peripheral circuits 102 to 106, of the flexible substrate 11. This structure can suppress the hardened region 12, i.e., the region in which the peripheral circuits are formed, from being bent even when a load is applied to the flexible display 100. As a result, peeling of the electronic element 15 due to bending and occurrence of connection defects between the electronic element 15 and the wiring line 13 can be prevented. Therefore, the peeling of the peripheral circuits (electronic element 15) mounted on the wiring substrate 10 can be prevented while the flexibility of the wiring substrate 10 is totally secured.

This embodiment also can improve the driving capability of the display compared to the use of an organic TFT since the peripheral circuits are formed by the electronic element 15 that is provided with a polysilicon TFT and mounted on the flexible substrate 11.

In addition, the pixel area 101, which is provided with an organic TFT as a switching element and disposed on the flexible substrate 11, can be formed by a coating method or a printing method. As a result, material and energy consumption can be suppressed. This reduces the environmental load and allows a low-cost manufacturing. The above merits in manufacturing can be obtained without lowering the driving capability of the display since the pixel area 101 has a little influence on the driving capability of the whole display.

The electronic apparatus of the invention can be applied to displays such as liquid crystal displays, organic EL displays other than electronic papers since the apparatus is provided with the wiring substrate having flexibility. The electronic apparatus of the invention also can be applied to video tape recorders of viewfinder types or monitor viewing types, car navigation devices, pagers, personal digital assistants, electric calculators, electronic newspapers, word processors, personal computers, work stations, picture phones, POS terminals, apparatuses equipped with a touch panel and the like in addition to displays.

Second Embodiment

A method for manufacturing a wiring substrate according to a second embodiment of the invention will be described with reference to FIGS. 9A and 9B.

Figure 9A:
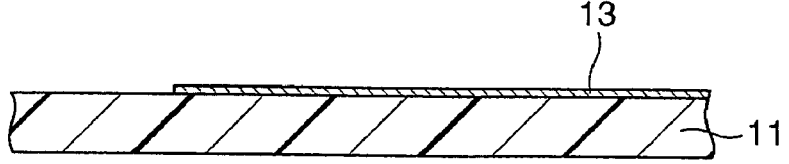
FIGS. 9A and 9B are process sectional views illustrating a manufacturing of a wiring substrate of a second embodiment of the invention.
Figure 9B:
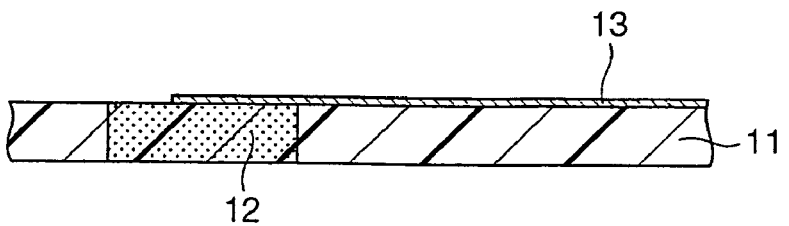

After the wiring line 13 is formed on the flexible substrate 11 as shown in FIG. 9A, the hardened region 12 may be formed to a region, in which an electronic element is mounted (element mounting region), of the flexible substrate 11 as shown in FIG. 9B. Details of each step are the same as described in the first embodiment.

The method for manufacturing a wired substrate of the second embodiment can achieve the same effect of the first embodiment.

Third Embodiment

A method for manufacturing a wiring substrate according to a third embodiment of the invention will be described with reference to FIGS. 10A to 10C.

Figure 10A:
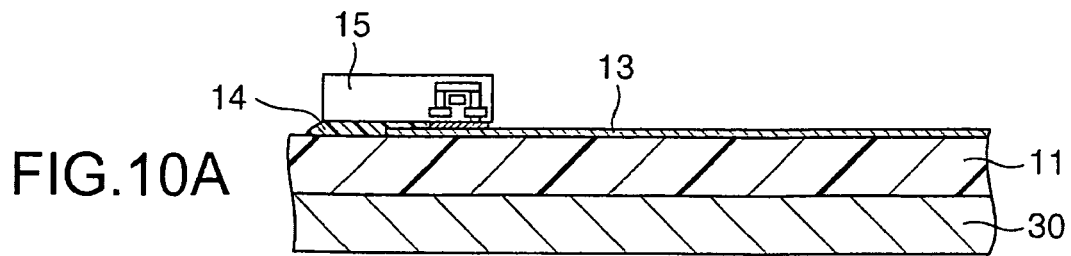
FIGS. 10A to 10C are process sectional views illustrating a manufacturing of a wiring substrate of a third embodiment of the invention.
Figure 10B:
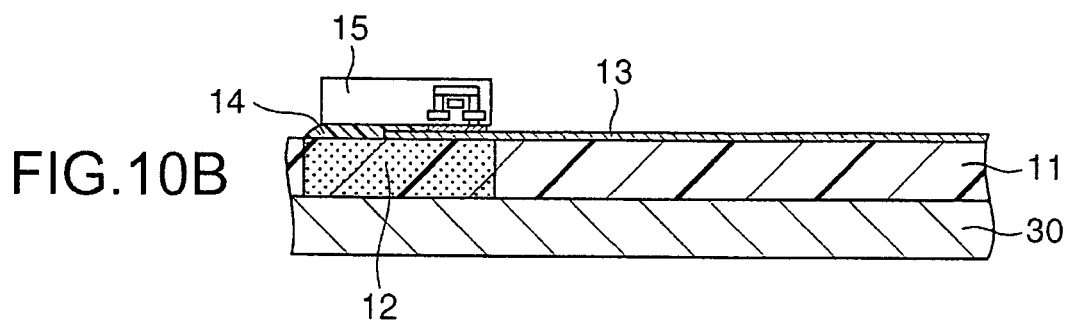
Figure 10C:
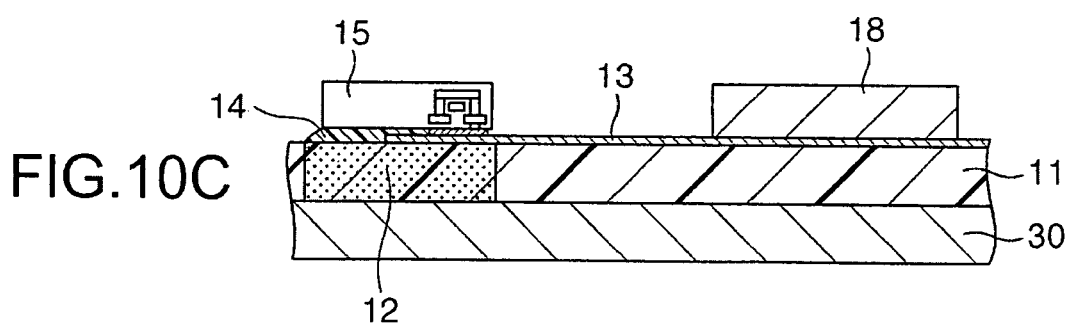

After the electronic element 15 is formed on the flexible substrate 11 as shown in FIG. 10A, the hardened region may be formed to a region, in which an electronic element is mounted, of the flexible substrate 11 as shown in FIG. 10B. Then, the active matrix circuit 18 may be formed as shown in FIG. 10C.

In a case where the forming accuracy of the hardened region 12 formed by light irradiation or the like is higher than the mounting accuracy of the electronic element 15, the hardened region 12 can be formed so as to adjust the position shift of the electronic element 15 and the like. Thus, the mounting region of the electronic element 15 and the hardened region 12 can be more accurately aligned than in the first embodiment.

Fourth Embodiment

Figure 11:
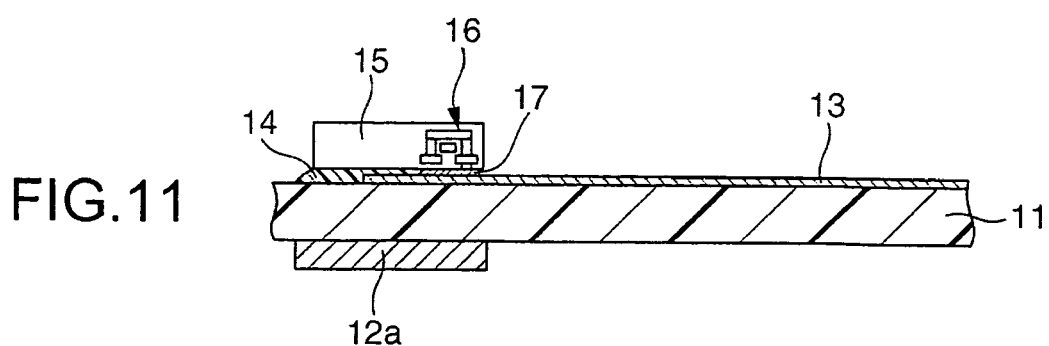
FIG. 11 is a sectional view illustrating a wiring substrate of a fourth embodiment of the invention.

FIG. 11 is a sectional view of a wiring substrate of a fourth embodiment of the invention.

As shown in FIG. 11, the wiring substrate of the fourth embodiment has a reinforcing layer 12a disposed on one surface of the flexible substrate 11. The one surface is opposite to the other surface on which the electronic element 15 is mounted. The reinforcing layer 12a is made of a material having flexibility lower than that of the flexible substrate 11. Examples of such material include SiN, SiC, BN, diamond-like carbon, and metals.

The embodiment requires the flexible substrate 11 to have flexibility, but does not require the flexible substrate 11 in itself to have many kinds of flexibility. The material for the flexible substrate 11 is not limited to thermosetting resins, light curable resins, electron beam curable resins and the like. Therefore, metal can be used for the flexible substrate 11.

The reinforcing layer 12a may be formed before the wiring line is formed as described in the first embodiment, or after the wiring line 13 is formed as in the second embodiment, or after the electronic element 15 is mounted as in the third embodiment.

The reinforcing layer 12a can be formed as follows: a material layer for the reinforcing layer 12a is formed by sputtering or CVD; a resist pattern is formed by photolithography; and the material layer is etched using the resist pattern. Alternatively, the reinforcing layer 12a cut in a desired pattern may be attached to the flexible substrate 11.

As the wiring substrate of the fourth embodiment, the flexibility of the mounting region of the electronic element 15 can be practically reduced by providing the reinforcing layer 12a on the flexible substrate 11 without changing the flexibility of the flexible substrate 11 in itself.

It should be understood that the invention is not limited to the above-described embodiments.

It will be appreciated that various changes can be made within the scope and spirit of the invention.

What is claimed is:

1. A method for manufacturing a wiring substrate, comprising:
   forming a wiring line on a flexible substrate having a first region and a second region;
   reducing flexibility of the first region of the flexible substrate; and
   fixing an electronic element to the first region,
   wherein the flexible substrate includes a resin to be hardened by applying predetermined energy, and the energy is supplied to the first region in the reducing of the flexibility of the first region.

2. A method for manufacturing a wiring substrate, comprising:
   reducing flexibility of a first region of a flexible substrate;
   forming a wiring line on the flexible substrate; and
   fixing an electronic element to the first region,
   wherein the flexible substrate includes a resin to be hardened by applying predetermined energy, and the energy is supplied to the first region in the reducing of the flexibility of the first region.

3. The method for manufacturing a wiring substrate according to claim 2, wherein the reducing of the flexibility of the first region further includes forming a reinforcing layer having flexibility lower than flexibility of the second region.

4. The method for manufacturing a wiring substrate according to claim 2, wherein the flexibility of the first region is continuously reduced in a peripheral region thereof in the reducing of the flexibility of the first region.

5. The method for manufacturing a wiring substrate according to claim 2, wherein the electronic element further includes a terminal, and the terminal is electrically coupled to the wiring line to fix the electronic element on the flexible substrate in the fixing of the electronic element.

6. A method for manufacturing a wiring substrate, comprising:
   forming a wiring line on a flexible substrate;
   fixing an electronic element to a first region of the flexible substrate; and
   reducing flexibility of the first region,
   wherein the flexible substrate includes a resin to be hardened by applying predetermined energy, and the energy is supplied to the first region in the reducing of the flexibility of the first region.

* * * * *